United States Patent
Mason et al.

(10) Patent No.: US 12,352,630 B2
(45) Date of Patent: Jul. 8, 2025

(54) RAPID TEMPERATURE CHANGE DETECTION USING SLEW RATE

(71) Applicant: Texas Instruments Incorporated, Dallas, TX (US)

(72) Inventors: Andrew Nicholas Mason, McKinney, TX (US); Shobha Subramanian, Richardson, TX (US); Hussain Kutbuddin Attarwala, McKinney, TX (US); Ryan Wade Selby, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 706 days.

(21) Appl. No.: 17/491,395

(22) Filed: Sep. 30, 2021

(65) Prior Publication Data
US 2023/0096883 A1 Mar. 30, 2023

(51) Int. Cl.
| | | |
|---|---|---|
| *G01K 1/024* | (2021.01) | |
| *G01K 1/02* | (2021.01) | |
| *G01K 3/00* | (2006.01) | |
| *G01K 7/01* | (2006.01) | |
| *G08B 21/18* | (2006.01) | |
| *H03K 19/00* | (2006.01) | |
| *H03L 1/02* | (2006.01) | |

(52) U.S. Cl.
CPC ............ *G01K 1/024* (2013.01); *G01K 1/026* (2013.01); *G01K 3/005* (2013.01); *G01K 7/01* (2013.01); *G08B 21/182* (2013.01); *H03K 19/00* (2013.01); *H03L 1/027* (2013.01)

(58) Field of Classification Search
CPC ........ G01K 1/024; G01K 1/026; G01K 3/005; G01K 7/01; G01K 2219/00; G08B 21/182; H03K 19/00; H03L 1/027
See application file for complete search history.

(56) References Cited

U.S. PATENT DOCUMENTS 4,125,023 A * 11/1978 Amemiya ............... G01K 7/16
374/170
4,455,820 A * 6/1984 Buckley, Jr. ............ F02C 9/28
60/773

(Continued)

OTHER PUBLICATIONS

Texas Instruments, "The Engineer's Guide to Temperature Sensing,", 31 pages.

*Primary Examiner* — Nathaniel T Woodward
*Assistant Examiner* — Philip L Cotey
(74) *Attorney, Agent, or Firm* — Mandy Barsilai Fernandez; Frank D. Cimino

(57) ABSTRACT

An example apparatus includes: a temperature sensor including a temperature output, a register including an input and an output, the input coupled to the temperature output, a subtraction circuit including a first subtraction input, a second subtraction input, and a subtraction output, the first subtraction input coupled to the input of the register, the second subtraction input coupled to the output of the register, a timing circuit including a cycle time input, a shift output, and a direction output, and a division circuit including a division input, a shift input, a direction input, and a divided output, the division input coupled to the subtraction output, the shift input coupled to the shift output, the direction input coupled to the direction output.

20 Claims, 6 Drawing Sheets

(56) References Cited

U.S. PATENT DOCUMENTS

| | | | | |
|---|---|---|---|---|
| 5,216,599 A * | 6/1993 | Uebe | ............... | A61D 17/002 |
| | | | | 128/920 |
| 5,225,811 A * | 7/1993 | Audy | ............... | G08B 21/182 |
| | | | | 340/661 |
| 6,130,793 A * | 10/2000 | Ohmori | ............... | G11B 19/04 |
| 7,165,183 B2 * | 1/2007 | Okada | ............... | G06F 11/00 |
| | | | | 702/132 |
| 7,371,005 B1 * | 5/2008 | Ahuja | ............... | H03L 1/02 |
| | | | | 368/202 |
| 10,247,621 B1 * | 4/2019 | Partridge | ............... | H03K 3/0315 |
| 2002/0108942 A1 * | 8/2002 | Yamanoi | ............... | H05B 3/0095 |
| | | | | 219/494 |
| 2003/0226084 A1 * | 12/2003 | Okada | ............... | G06F 1/324 |
| | | | | 714/E11.018 |
| 2005/0242836 A1 * | 11/2005 | Goetting | ............... | G01R 31/3167 |
| | | | | 326/39 |
| 2007/0057651 A1 * | 3/2007 | Hoffman | ............... | G05F 1/147 |
| | | | | 323/258 |
| 2007/0222461 A1 * | 9/2007 | Miller | ............... | G01D 3/036 |
| | | | | 324/656 |
| 2008/0117722 A1 * | 5/2008 | Ahuja | ............... | G04F 5/06 |
| | | | | 368/202 |
| 2012/0265473 A1 * | 10/2012 | Arisaka | ............... | G01K 7/01 |
| | | | | 702/99 |
| 2014/0002133 A1 * | 1/2014 | Daigle | ............... | H03K 19/017509 |
| | | | | 326/80 |
| 2015/0330841 A1 * | 11/2015 | Kern | ............... | G06F 1/206 |
| | | | | 702/136 |
| 2018/0240423 A1 * | 8/2018 | Park | ............... | G09G 3/3685 |
| 2022/0059165 A1 * | 2/2022 | Satou | ............... | H03K 19/0005 |
| 2022/0065709 A1 * | 3/2022 | Li | ............... | H03F 3/087 |

* cited by examiner

RAPID TEMPERATURE CHANGE DETECTION USING SLEW RATE

TECHNICAL FIELD

This description relates generally to circuits, and more particularly to rapid temperature change detection using slew rate.

BACKGROUND

Temperature sensors may be used to measure a temperature of a component. A host device (e.g., microcontroller) is conventionally used to monitor a temperature sensor. In some applications, the host device samples an analog value from the temperature sensor. The host device converts the sampled analog value to a digital value using an analog to digital converter (ADC), resulting in a digital value representative of a temperature measurement. The host device uses the digital value of the temperature measurement to monitor the temperature of the component. The host device may determine that the measured temperature is too high for the component and may reduce the operations of the component, such that the temperature may decrease. In some applications. the host device may predict a temperature of the component, based on previous temperature measurements. For some components that are temperature sensitive, the gap of time between the host device sampling the analog value from the temperature sensor and determining the digital value representative of the temperature is enough time to harm the component.

SUMMARY

For rapid temperature change detection using slew rate, an example apparatus includes a latch register circuit including a temperature sensor including a temperature output, a register including an input and an output, the input coupled to the temperature output, a subtraction circuit including a first subtraction input, a second subtraction input, and a subtraction output, the first subtraction input coupled to the input of the register, the second subtraction input coupled to the output of the register, a timing circuit including a cycle time input, a shift output, and a direction output, and a division circuit including a division input, a shift input, a direction input, and a divided output, the division input coupled to the subtraction output, the shift input coupled to the shift output, the direction input coupled to the direction output.

BRIEF DESCRIPTION OF THE DRAWINGS

The same reference numbers or other reference designators are used in the drawings to designate the same or similar (functionally and/or structurally) features.

DETAILED DESCRIPTION

A high temperature may irreversibly damage some temperature sensitive components. A conventional method of combatting a high temperature event is to measure the temperature of a component using a temperature sensor. A host system (e.g., a microcontroller) may be used to monitor the temperature sensitive component by sampling an analog value from the temperature sensor. The host device may use an ADC to convert the sampled analog value to a digital value representative of a temperature. The host device may monitor the temperature of the temperature sensitive component by sampling the analog temperature value from the temperature sensor in a periodic cycle.

The host device may be configured to reduce the power supplied and/or reduce the clock speed to the component as a result of the measured temperature being larger than a high temperature threshold. The host device may be configured to sample the temperature sensor periodically to reduce the amount of time that the component is exposed to a temperature greater than the high temperature threshold. The smaller the time gap between periodic measurements of the temperature, the less time the component may be exposed to a temperature greater than the high temperature threshold. The processing load of monitoring the temperature increases as a result of the time between temperature measurements decreases.

Some example embodiments involve circuitry and/or methodology for determining whether a high temperature event has happened or is likely to happen. The circuitry/methodology of these example embodiments track the rate of change (e.g. slew rate) of the measured temperature (of a hot spot or a potential hot spot, for example) so as to timely provide a temperature warning without undue loading of a host device. The rapid temperature change detection using the slew rate method described herein includes circuitry that decreases the processing load on a host device (e.g., microcontroller, computer operating system, etc.) associated with continually measuring the temperature of a component. The rapid temperature change detection using slew rate circuitry uses a plurality of temperature measurements to determine a slew rate. The determined slew rate represents the change in temperature per unit of time. The slew rate determined by the rapid temperature change detection using slew rate circuitry is compared to a reference high slew rate value to predict if the component may be exposed to a high temperature. The rapid temperature change detection using slew rate circuitry sends an alert pulse to the host device as a result of the determined slew rate predicting a temperature that is greater than the high temperature threshold. The rapid temperature change detection using slew rate circuitry is configured to determine if the temperature sensitive component may be exposed to a high temperature before the component temperature reaches the high temperature.

Figure 1:
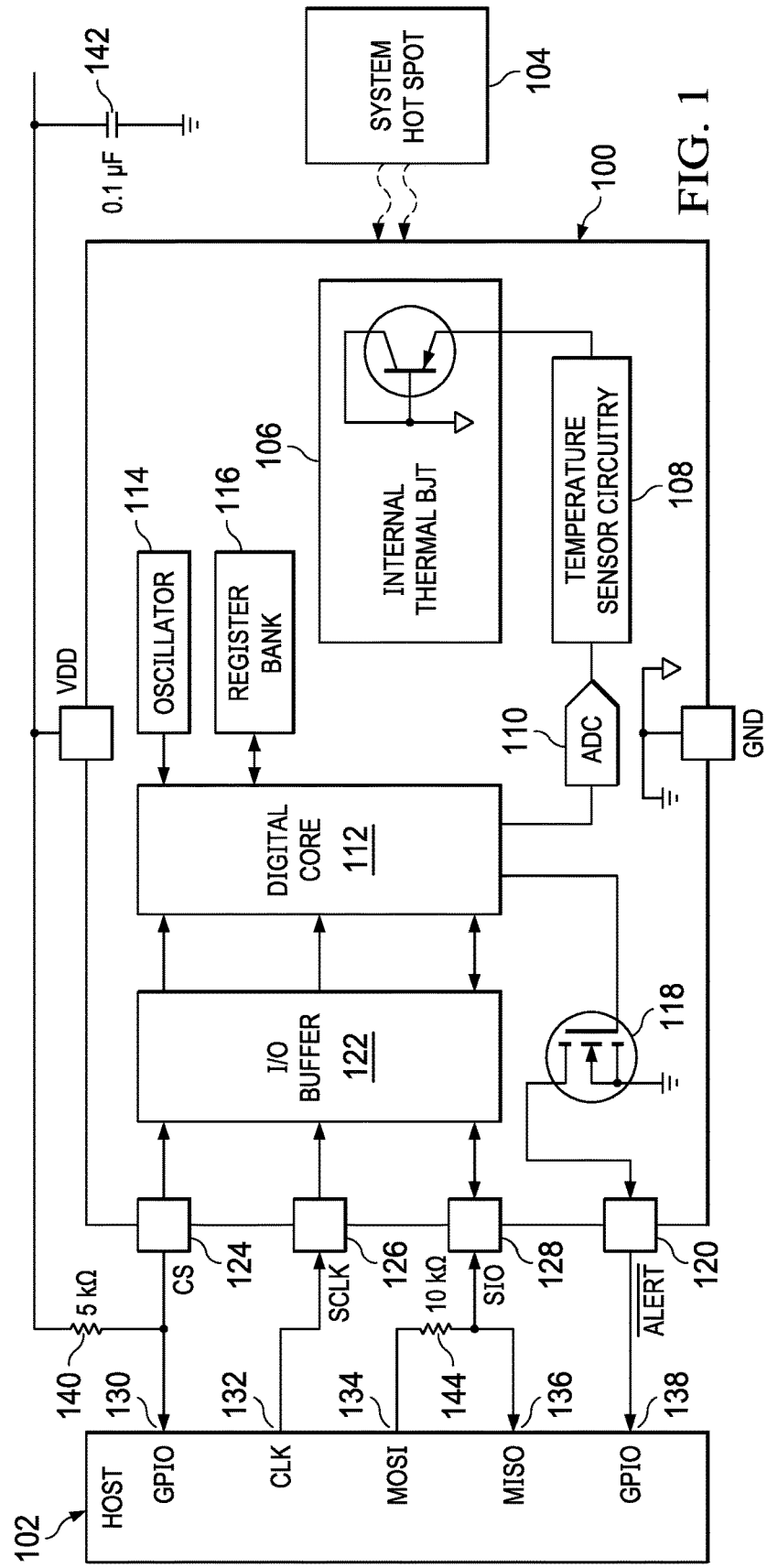
FIG. 1 is a schematic diagram of a circuit of an example embodiment to detect rapid temperature change using slew rate.

FIG. 1 is a schematic diagram of a circuit 100 to detect rapid temperature change using slew rate. In the example of FIG. 1, the circuit 100 is configured to interface with a host device 102 to monitor the temperature of a system hot spot 104 (e.g. the temperature of an electronic device, such as a processor, or a medical cauterization probe). The circuit 100 is configured to operate as a slew rate temperature change sensor that transmits an alert pulse to the host device 102 in response to a predicted high temperature at system hot spot 104. In the example of FIG. 1, the circuit 100 includes an example thermal bipolar junction transistor (BJT) 106, an example temperature sensor circuitry 108, an example ADC 110, an example digital core 112, an example oscillator 114, an example register bank 116, an example transistor 118, an example alert output terminal 120, an example input/output (I/O) buffer 122, an example chip select (CS) terminal 124, an example source clock (SCLK) terminal 126, and an example communication (SIO) terminal 128. Alternatively, the thermal BJT 106 and temperature sensor circuitry 108 may be any temperature measurement circuit or resistive thermometer.

In the example of FIG. 1, the thermal BJT 106 is coupled to the temperature sensor circuitry 108. A temperature output of the temperature sensor circuitry 108 is coupled to an analog input of the ADC 110. A digital output of the ADC 110 is coupled to the digital core 112. A clock signal input of the digital core 112 is coupled to a clock signal output of the oscillator 114 (or any type of internal or external clocking signal source). In some examples the ADC 110 may generate a plurality of digital outputs to represent the temperature measurement. A register bank input of the digital core 112 is coupled to the register bank 116. The register bank 116 includes a plurality of registers. The register bank 116 may be configured to communicate with the digital core 112. The digital core 112 is coupled to the transistor 118. The transistor 118 is coupled to the alert output terminal 120. The digital core 112 is coupled to the I/O buffer 122. The I/O buffer 122 is coupled to the chip select terminal 124 (CS), the source clock terminal 126 (SCLK), and the communication terminal 128 (serial input/output terminal or SIO).

In the example of FIG. 1, the host device 102 includes a first example general purpose input output (GPIO) terminal 130, an example clock (CLK) terminal 132, an example master output slave input (MOSI) terminal 134, an example master input slave output (MISO) terminal 136, and a second example GPIO terminal 138. The host device 102 may be configured to use the serial peripheral interface (SPI) protocol to communicate (read and/or write) data to the circuit 100. Alternatively, the host device may be configured to use inter-integrated circuit (I2C) protocol or any communication protocol to communicate data to the circuit 100. The first GPIO terminal 130 may be a resistor coupled to the voltage source VDD. The second GPIO terminal 138 may be configured to any input of the host device 102 that may be configured to receive a digital pulse. Implementations of the second GPIO terminal 138 may include a hardware interrupt configured to wait for an alert input pulse.

In the example of FIG. 1, the chip select terminal 124 is coupled to the first GPIO terminal 130. A first example resistor 140 is coupled between voltage source VDD and the first GPIO terminal 130. An example capacitor 142 is coupled between voltage source VDD and common potential (e.g., ground). The source clock terminal 126 is coupled to the clock terminal 132. A second example resistor 144 is coupled between the communication terminal 128 and the MOSI terminal 134. The communication terminal 128 is coupled to the MISO terminal 136. The alert output terminal 120 is coupled to the second GPIO terminal 138.

In some examples, the circuit 100 is a single integrated circuit (IC) (such as circuitry implemented on a single semiconductor die or on multiple die but within a single IC package). For example, the thermal BJT 106 and the temperature sensor circuitry 108 may be included on the same semiconductor die. In some examples, the circuit 100 may be implemented by two or more ICs in a single IC package to implement a multi-chip module (MCM). In some examples, the circuit 100 may be implemented by two or more ICs (such as two or more IC packages). For example, digital core 112 may be on a first die and the ADC 110 may be on a second die. In some examples, the register bank 116 may be on a first die, the digital core 112 may be on a second die, and the transistor 118 and input/output buffer 122 may be on a third die. Alternatively, one or more hardware circuit components (such as the transistor 118, the thermal BJT 106, the oscillator 114, the ADC 110, etc.) of the circuit 100 may be included in the host device 102.

In example operation, the thermal BJT 106 measures the temperature of the system hot spot 104. Examples of measuring temperature with a thermal BJT are shown in "*The Engineer's Guide to Temperature Sensing*" published by Texas Instruments (of which is incorporated by reference in its entirety). The temperature sensor circuitry 108 generates an analog voltage representation of the temperature measured by the thermal BJT 106. The ADC 110 generates a digital value to represent the analog voltage representing the temperature measured by the thermal BJT 106. The ADC 110 converts the analog voltage to a digital value representative of the measured temperature. The digital core 112 determines a slew rate of the temperature at the system hotspot 104 using the oscillator 114, to measure the change in time between measurements, and the digital value of the sensed temperature from the ADC 110. Advantageously, the determination of the slew rate of the temperature of the system hot spot 104 occurs despite the state of the host device 102.

In example operation, the digital core 112 is configured to compare the determined slew rate to a threshold slew rate stored in the register bank 116. The digital core 112 predicts if the system hot spot 104 may reach a temperature greater than or equal to the high temperature threshold based on the determined slew rate (e.g., rate of change of the sensed temperature). The digital core 112 is configured to generate an alert pulse in response to measuring and/or predicting a temperature greater than the high temperature threshold stored in the register bank 116. The alert pulse from the digital core 112 is transmitted to the transistor 118 resulting in the alert output terminal 120 alerting the host device 102 (by, for example, changing states, such as transitioning from a logic "1" or higher voltage value to a logic "0" or lower voltage value, or vice versa). Advantageously, the calculations required to predict a high temperature event occurs in the digital core 112, preventing additional processing load on the host device 102.

In example operation, the host device 102 is configured to communicate with the circuit 100. The host device 102 may use the MOSI terminal 134 to communicate to the digital core 112. The host device 102 may use the communication terminal 128 to adjust register values in the register bank 116 (e.g. the slew threshold limit register). The communication terminal 128 is configured to be the communication input and communication output of the circuit 100. The first GPIO terminal 130 may be configured as a communication control output, such that the first GPIO terminal 130 set to a first logic value (representing a logic value of '1') enables the circuit 100 to communicate with the host device 102.

Advantageously, including the register bank 116 as a component of the circuit 100 enables operation without requiring a method to access the memory of the host device 102, further reducing the processing load that monitoring the system hot spot places on the host device 102.

Figure 2:
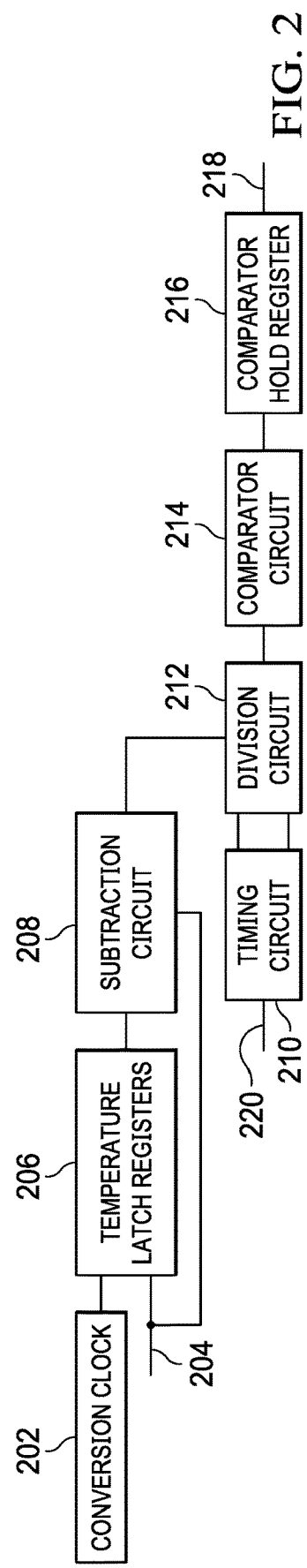
FIG. 2 is a block diagram of example digital logic of the circuit of FIG. 1.

FIG. 2 is a block diagram of example digital logic of the circuit 100 of FIG. 1. The digital logic operations are processed by the digital core 112 of FIG. 1. In the example of FIG. 2, the digital logic of the circuit 100 of FIG. 1 includes an example conversion clock 202, an example temperature input 204, an example temperature latch register circuit 206, an example subtraction circuit 208, an example timing circuit 210, an example division circuit 212, an example comparator circuit 214, an example comparator hold register 216 and an example slew rate output 218.

In the example of FIG. 2, the conversion clock 202 is coupled to a first input of the temperature latch register circuit 206. The temperature input 204 is coupled to a second input to the temperature latch register circuit 206. The temperature input 204 is coupled to a first input of the subtraction circuit 208. An output of the temperature latch register circuit 206 is coupled to a second input of the subtraction circuit 208. An output of the subtraction circuit 208 is coupled to a first input of the division circuit 212. A first and a second output of the timing circuit 210 is coupled to a second and third input of the division circuit 212. An output of the division circuit 212 is coupled to an input of the comparator circuit 214. An output of the comparator circuit 214 is coupled to an input of the comparator hold register 216. An output of the comparator hold register 216 is coupled to the slew rate output 218.

In example operation, the temperature input 204 receives an N-bit digital representation of a measured temperature, where N is the number of bits of the digital value representing the measured temperature. Based on the conversion clock 202, the temperature latch register circuit 206 holds the digital representation of the previous measured temperature value and, in some examples, the most recent measured temperature value. The conversion clock 202 is configured to send a pulse to the temperature latch register circuit 206 in response to the completion of the conversion (e.g., temperature conversion by the ADC 110 of FIG. 1 or the conversion of temperature to slew). The temperature latch register circuit 206 is configured to store the value of the temperature input 204 based on a pulse from the conversion clock. The subtraction circuit 208 is configured to subtract the digital representation of the previous measured temperature value (stored in the temperature latch register circuit 206) from the digital representation of the most recent measured temperature value (e.g., from the temperature input 204 or, for some examples, from the temperature latch register circuit 206). The subtraction circuit 208 is configured to output an N plus five-bit (N+5 bit) representation of the subtraction of the current temperature from the previous temperature to the first input of the division circuit 212. Advantageously, the subtraction circuit 208 determines the change in temperature between a plurality of temperature measurements.

The timing circuit 210 includes a cycle time input 220. The timing circuit 210 is configured to determine the time elapsed between two temperature measurements. The cycle time input 220 may be a three-bit representation of the present cycle time. The difference between cycle time input 220 and a three-bit representation of a prior cycle is the number of cycles between temperature measurements. The three-bit reference value may be configured to be the cycle time of the previous temperature measurement. Alternatively, the elapsed time between measurements may be determined in any other manner. The first output of the timing circuit 210 is configured to represent the number of bits the division circuit may shift the output of the subtraction circuit 208 based on the difference in cycle times between the current temperature measurement and the previous temperature measurement. The second output of the timing circuit 210 is configured to represent if the division circuit 212 should shift the output of the subtraction circuit 208 to the left or right based on the two most significant bits of the cycle time input 220.

The division circuit 212 is configured to shift a division input to the left or right, such that the division input is divided by a power of two. For example, a one-bit left shift of the division input results in the output of the division circuit 212 to be two times the division input, such that the denominator of the division is equal to one half (or $2^{-1}$). A one-bit right shift of the division input results in the output of the division circuit 212 to be approximately half the division input, such that the denominator of the division is two (or $2^1$). The division input of the division circuit 212 is coupled to the output of the subtraction circuit 208, such that the change is temperature is numerator. The number of bits to shift the division input by is the first output of the timing circuit 210. The direction of the bit shift is represented by the second output of the timing circuit 210. The output of the division circuit 212 is the untrimmed value of the slew rate. The slew rate at the output of the division circuit 212 represents the difference between two temperature measurements that are separated by a conversion time, divided by the conversion time.

The comparator circuit 214 compares the slew rate determined by the division circuit 212 to a reference value. The comparator circuit 214 determines, based on the comparator inputs, whether the calculated slew rate (based on the most recent sensed current and the previously sensed current) is between a range of reference values. The comparator circuit 214 may digitally trim (remove) bits from the output of the division circuit 212, to account for any process issues, based on the desired accuracy. For example, the output of the division circuit 212 may be a 20-bit untrimmed slew rate that may be digitally trimmed to a 14-bit representation of the slew rate, such that the bottom 2-bits (the two bits of the highest precision and smallest magnitude) and the top 4-bits (part of the copied MSB of the change in temperature) are not coupled to the output of the comparator circuit 214. The comparator hold register 216 stores the compared slew rate on the slew rate output 218. Advantageously, the digital logic of the circuit 100 of FIG. 1 does not require a host device 102 of FIG. 1 to determine the slew rate of the temperature of the system. Advantageously, the digital logic of the circuit 100 of FIG. 1 determines the slew rate of the temperature measurements.

Figure 3A:
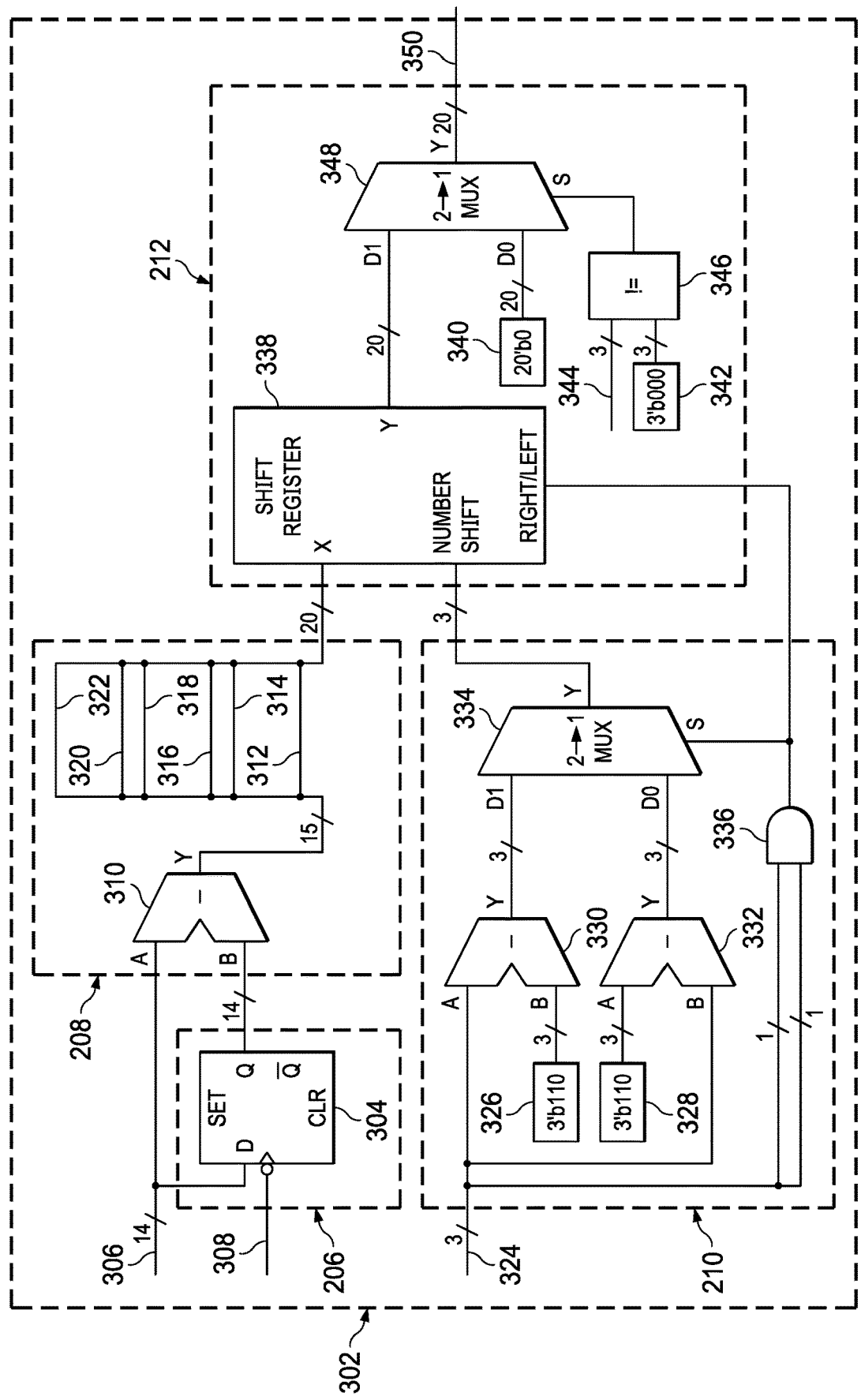
FIG. 3A is a schematic diagram of the digital logic used to determine the slew rate for the circuit from FIG. 1.

FIG. 3A is a schematic diagram of the digital logic used to determine the slew rate for the circuit 100 from FIG. 1. In the example of FIG. 3A the slew digital logic circuit 302 includes the temperature latch register circuit 206, the subtraction circuit 208, the timing circuit 210, and the division circuit 212. The slew digital logic circuit 302 determines an untrimmed slew rate of temperature measurements. The untrimmed slew rate includes a plurality of bits representing the slew rate between a plurality of temperature measurements (the trimmed slew rate) and a plurality of additional bits added to preserve the precision of the slew rate.

In the example of FIG. 3A, the temperature latch register circuit 206 includes a first example array of registers 304 (e.g., D-latches). The first array of D-Latches 304 includes N number of latches to correspond to N bits in a digital value from an array of temperature input 306. The "D" input of each of N-number of D-latches 304 is connected to one of the N-number of signal lines 306, and each of the N-number of "Q" outputs is connected to one of the N-number of signal lines connected to the B input of subtraction circuit 310. The first array of D-Latches 304 includes a conversion clock input 308 coupled to a clock signal supplied by the conversion clock 202 of FIG. 2. The first array of D-Latches 304 is configured for each of the N number of D-Latches to correspond to a bit of the N bit digital value representing the measured temperature. The latch outputs of the first array of D-Latches 304 are configured to represent a previous temperature measurement. Alternatively, the first array of D-Latches 304 may be an array of any latches, an array of any combination of latches, a register, and/or memory.

In the example of FIG. 3A, the subtraction circuit 208 includes a first example subtraction circuit 310, a first example array of subtraction circuit outputs 312, a first example most significant bit (MSB) copy branch 314, a second example MSB copy branch 316, a third example MSB copy branch 318, a fourth example MSB copy branch 320, and a fifth example MSB copy branch 322. The branches 314-322 are configured to extend the 15-bit representation of the difference between the current temperature measurement and the previous temperature measurement (the first array of subtraction circuit outputs 312), such that one or more left bit shifts may occur without shifting out the MSB of the determined slew rate. Alternatively, the first subtraction circuit 310 may be implemented using computer software.

In the example of FIG. 3A, the first subtraction circuit 310 includes N number of subtraction circuit outputs to correspond to N bits of the digital value representing the temperature measurement. The first subtraction circuit 310 includes two times N number of subtraction inputs to correspond to N bits of the digital value representing the temperature measurement and N bits of the digital value representing a previous temperature measurement. The first subtraction circuit 310 is configured for each of the N number of subtraction circuit outputs to correspond to a corresponding bit in the difference between the digital value representing the temperature measurement and the digital value representing the previous temperature measurement. In some embodiments, the first subtraction circuit 310 subtracts the previously-measured temperature value (provided at input B as an N-bit digital value) from the most recently measured temperature value (provided at input A as an N-bit digital value) or vice versa.

In the example of FIG. 3A, the timing circuit 210 includes an example array of cycle time inputs 324, a first example reference register 326, a second example reference register 328, a second example subtraction circuit 330, a third example subtraction circuit 332, a first example multiplexer 334, and a first example logic gate 336. In the example of FIG. 3A, the first logic gate is an AND logic gate.

In the example of FIG. 3A, the array of cycle time inputs 324 (e.g., an implementation of input 220 in FIG. 2) includes a plurality of cycle time terminals to represent the current cycle time in bits. The second subtraction circuit 330 is configured to subtract the first reference register 326 from the digital value of the array of cycle time inputs 324. For example, the second subtraction circuit 330 may be configured to subtract a three-bit representation of the cycle time of the previous temperature measurement (stored in the first reference register 326) from a three-bit representation of the cycle time of the current temperature measurement (the array of cycle time inputs 324). An output of the second subtraction circuit 330 is coupled to a first input of the first multiplexer 334. The third subtraction circuit 332 is configured to subtract the value of the array of cycle time inputs 324 from the second reference register 328. For example, the third subtraction circuit 332 may be configured to subtract a three-bit representation of the cycle time of the current temperature measurement (the array of cycle time inputs 324) from a three-bit representation of the cycle time of the previous temperature measurement (stored in the second reference register 328). An output of the third subtraction circuit 332 is coupled to a second input of the first multiplexer 334. A control input of the first multiplexer 334 is coupled to an output of the first logic gate 336. A control input of an example multiplexer determines the input that is coupled to the output.

A first input of the array of cycle time inputs 324 (e.g., a single bit of the plurality of bits from the array of cycle time inputs 324) is coupled to a first input of the first logic gate 336. A second input of the array of cycle time inputs 324 (e.g., a single bit of the plurality of bits from the array of cycle time inputs 324 that is different than the single bit connected to the first input) is coupled to a second input of the first logic gate 336. The first logic gate 336 is configured to control the first multiplexer 334 based on the current cycle time (the array of cycle time inputs 324). The first logic gate 336 may configure the first multiplexer to the second subtraction circuit 330 to indicate enough time passed to divide (or a right bit shift) the change in temperature by the change in cycle time from the output of the second subtraction circuit 330. The first logic gate 336 may configure the first multiplexer to the third subtraction circuit 332 to indicate that the time passed results in multiplying (or a left-bit shift) the change in temperature by the change in cycle time from the output of the third subtraction circuit 332.

In the example of FIG. 3A, the division circuit 212 includes an example shift register 338, a third example reference register 340, a fourth example reference register 342, a second example array of cycle time inputs 344, a second example logic gate 346, and a second example multiplexer 348. The second logic gate 346 is an XOR logic gate, to perform a bitwise but not equal to function on the inputs.

In the example of FIG. 3A, the output of the subtraction circuit 208 is coupled to a first input of the shift register 338. The first input of the shift register 338 is the division input configured to be bit shifted, such that the change in temperature between measurements (the output of the subtraction circuit 208) is the numerator of the division. The output of the first multiplexer 334 from the timing circuit 210 is coupled to a second input of the shift register 338. The second input of the shift register 338 is configured to represent the number of bits the digital value at the first input is to be shifted, such that the change in time between temperature measurements (the output of the first MUX 334) is the denominator of the division (represented by a power of two). The output of the first logic gate 336 is coupled to a third input of the shift register 338. The third input of the shift register 338 is configured to set the direction of the bit shift (the sign of the power of two in the denominator) of the digital value at the first input of the shift register 338, such that the change in temperature may be multiplied (in response to too few cycles of time passing between measurements) or divided (in response to enough cycles of time passing between temperature measurements) by the change in time.

In the example of FIG. 3A, a first input of the second multiplexer 348 is coupled to the shift output of the shift register 338. A second input of the second multiplexer 348 is coupled to the third reference register 340. The fourth reference register 342 is coupled to a first input of the second logic gate 346. The second array of cycle time inputs 344 is coupled to a second input of the second logic gate 346. An output of the second logic gate 346 is coupled to a control input of the second multiplexer 348. The control input of the second multiplexer 348 is referenced to determine the input to be coupled to an output of the second multiplexer 350.

In example operation, the temperature latch register circuit 206 is configured to hold the digital representation of the previous temperature measurement as the result of a pulse on the conversion clock input terminal 308. The subtraction circuit 208 is configured to subtract the previous temperature measurement being held by the temperature latch register circuit 206 from the current temperature measurement from the array of temperature inputs 306. The subtraction circuit 208 is configured to extend 15-bit representation of the change in temperature between measurements to enable a shift register to perform both division and multiplication without a loss of precision. For example, if the shift register 338 left bit shifts the change in temperature by 2 bits, the MSB of the change in temperature may only be stored if the input to the shift register is 17 of more bits for a 15-bit representation of the change in temperature. The subtraction circuit 208 uses branches 314-322 to replicate the MSB of the output of the first subtraction circuit 310, such that the 6 most significant bits, of the determined change in temperature between measurements, are equal. The number of MSBs added to the change in temperature corresponds to the maximum potential number of left shifts to be performed. For example, the array of cycle time inputs 324 has a precision of 3-bits resulting in 8 different potential cycle times before the timing circuit 210 limits the maximum number of left shifts to 6 based on the first multiplexer 334 coupling the subtraction circuit to right shift for 2 of the potential 8 different cycle times. Alternatively, the first subtraction circuit 310 may include any plurality of branches to replicate the MSB. Advantageously, the subtraction circuit 208 determines the change in temperature between the previous temperature measurement being held by the temperature latch register circuit 206 and the current temperature measurement. Advantageously, the subtraction circuit 208 extends the determined difference in temperature by additional bits, such that digital trim and/or left bit shifts may be performed reducing the loss of precision from a bit shift operation.

The timing circuit 210 is configured to compare the amount of clock cycles between the time the temperature measurement being held by the temperature latch register circuit 206 was measured and the current temperature measurement from the array of temperature inputs 306. The difference in time between the held and current temperature measurements is determined by the conversion clock 202 of FIG. 2. An output of the conversion clock 202 of FIG. 2 is coupled to the conversion clock input 308 to initialize the tracking of the time difference by transitioning the temperature measurement from the array of temperature inputs 306 to the temperature measurement held by the temperature latch register circuit 206.

The timing circuit 210 generates a digital value indicating the number of bits to shift the output of the subtraction circuit 208. The number of bits to shift the output of the subtraction circuit 208 is determined by the subtraction circuits 330 and 332 by comparing the reference registers 328 and 326. For example, the third subtraction circuit 332 is configured to subtract the array of cycle time inputs 324 from the value of the second reference register 328 (configured to a 3-bit reference value). The value of the second reference register 328 may be configured to represent a hard coded value (e.g., a 3-bit digital "110") as a result of the cycle time resetting to zero after every time the temperature measurement is stored by the temperature latch register circuit 206. The timing circuit 210 uses the first logic gate 336 to determine if the bit shift should be to the left or the right. The first logic gate 336 is configured to compare the two MSBs of the array of cycle time inputs 324. The first logic gate 336 determines a left-bit shift of the change in temperature unless the array of cycle time inputs 324 is greater than or equal to both of the two MSBs of the array of cycle time inputs 324 being equal to one. Advantageously, the timing circuit 210 is configured to determine the difference in time between temperature measurements using the conversion clock 202 of FIG. 2.

The shift register 338 is configured to generate a change in temperature per unit of time based on the change in temperature from the subtraction circuit 208 and the change in time from the timing circuit 210. The division circuit 212 is configured to output the value of the third reference register 340 (a reference value to indicate an insufficient amount of time between measurements) as a result of the rate of temperature change being determined on the same clock pulse. The second logic gate 346 is configured to compare the second array of cycle time inputs 344 (the current cycle time) to the fourth reference register 342 (configured to store the cycle time of the previous measurement) to determine if both temperature measurements are from the same clock pulse. Alternatively, the value of the third reference register 340 may be configured to any value that contains the same number of bits as the output of the shift register 338. Alternatively, the second array of cycle time inputs 344 may be coupled to the first array of cycle time inputs 344. Advantageously, the shift register 338 generates the untrimmed rate of temperature change per unit of time (e.g., the untrimmed slew rate) using the shift register 338 to divide the temperature difference by the time difference.

Figure 3B:
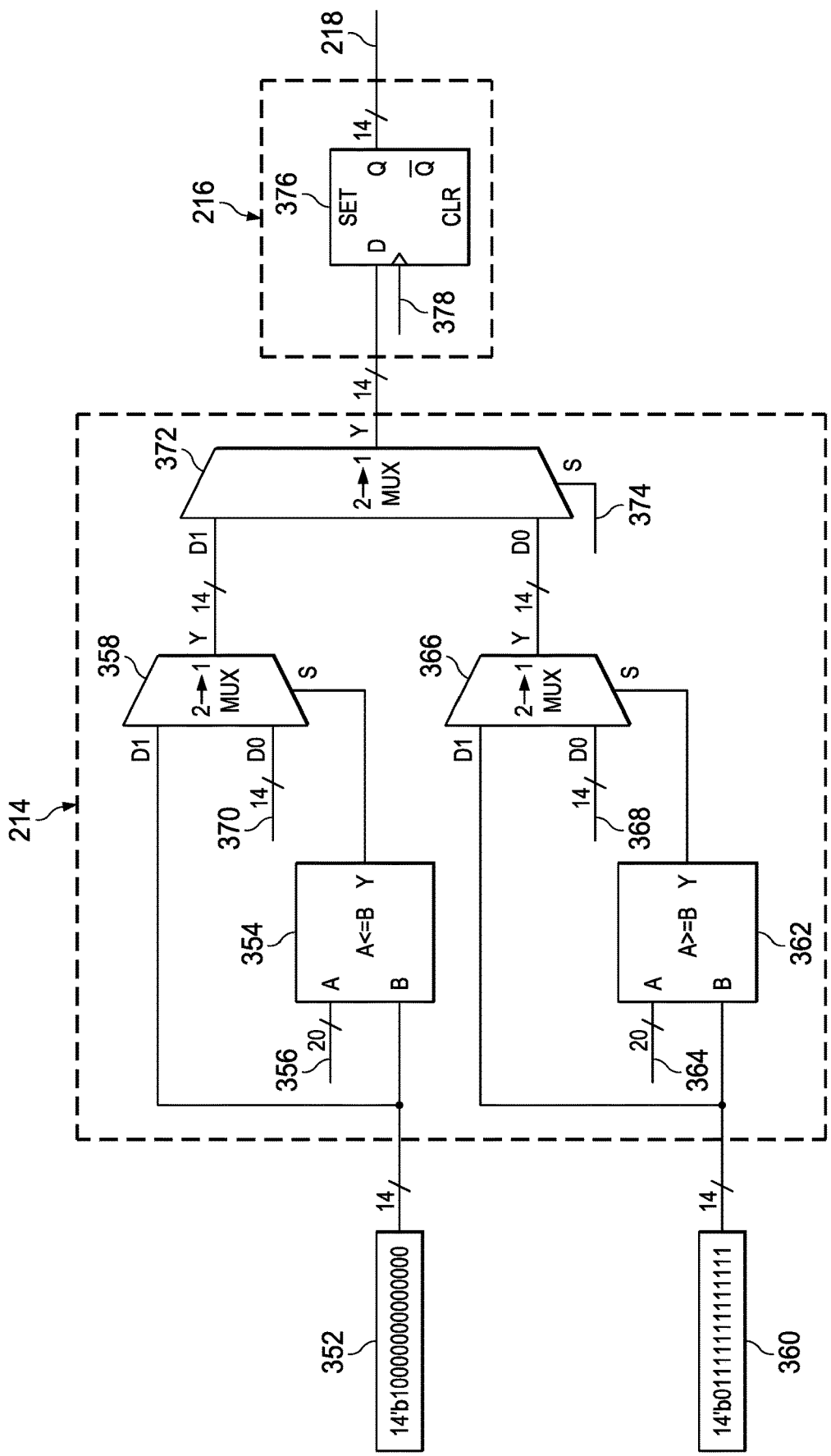
FIG. 3B is a schematic diagram of the digital logic to compare the slew rate for the circuit from FIG. 1.

FIG. 3B is a schematic diagram of the digital logic to compare the determined slew rate from the circuit of FIG. 2. In the example of FIG. 3B the digital logic to compare the untrimmed slew rate includes the comparator circuit 214, the comparator hold register 216, and the slew rate output 218.

In the example of FIG. 3B, the comparator circuit 214 includes a fifth example reference register 352, a third example logic gate 354, a first example array of temperature change rate inputs 356, a third example multiplexer 358, a sixth example reference register 360, a fourth example logic gate 362, a second example array of temperature change rate inputs 364, a fourth example multiplexer 366, a third example array of temperature change rate inputs 368, a fourth example array of temperature change rate inputs 370, a fifth example multiplexer 372, and an example temperature change rate MSB 374. The third logic gate 354 is a less than or equal too comparator. The fourth logic gate 362 is a greater than or equal too comparator. The temperature change rate represents the output of the division circuit 212 as a digitally trimmed slew rate input.

In the example of FIG. 3B a first input of the third logic gate 354 is coupled to the first array of temperature change rate inputs 356. The first array of temperature change rate inputs 356 is coupled to the output of the division circuit 212, such that the first array of temperature change rate inputs 356 represents the untrimmed slew rate. Alternatively, the first array of change rate inputs 356 may be coupled to a register storing the output of the division circuit 212. The fifth reference register 352 is coupled to a second input of the third logic gate 354. The fifth reference register 352 may store a value representing a first approximation of slew rate as a result of the first array of temperature change rate input 356 being less than or equal to the first approximation of the slew rate. The fifth reference register 352 is coupled to a first input of the third multiplexer 358. A second input of the third multiplexer 358 is coupled to the fourth array of temperature change rate inputs 370. The fourth array of temperature change rate inputs 370 represents a trimmed version of the untrimmed slew rate (the output of the division circuit 212), such that fourth array of temperature change rate inputs 370 is a portion of the untrimmed slew rate. The fourth array of temperature change rate inputs 370 may be coupled to a portion of the output of the division circuit 212 or to a register configured to store the portion of the output of the division circuit 212. The output of the third logic gate 354 is coupled to a control input of the third multiplexer 358.

A first input of the fourth logic gate 362 is coupled to the second array of temperature change rate inputs 364. The second array of temperature change rate inputs 364 is coupled to the output of the division circuit 212, such that the second array of temperature change rate inputs 364 represents the untrimmed slew rate. Alternatively, the second array of change rate inputs 364 may be coupled to a register storing the output of the division circuit 212. The sixth reference register 360 is coupled to a second input of the fourth logic gate 362. The sixth reference register 360 may store a value representing a second approximation of slew rate as a result of the second array of temperature change rate input 364 being greater than or equal to the second approximation of the slew rate. The sixth reference register 360 is coupled to a first input of the fourth multiplexer 366. A second input of the fourth multiplexer 366 is coupled to the third array of temperature change rate inputs 368. The third array of temperature change rate inputs 368 represents a trimmed version of the untrimmed slew rate (the output of the division circuit 212), such that third array of temperature change rate inputs 368 is a portion of the untrimmed slew rate. The third array of temperature change rate inputs 368 may be coupled to a portion of the output of the division circuit 212 or to a register that stores the portion of the output of the division circuit 212. The output of the fourth logic gate 362 is coupled to a control input of the fourth multiplexer 366. The output of the third multiplexer 358 is coupled to a first input of the fifth multiplexer 372. The output of the fourth multiplexer 366 is coupled to a second input of the fifth multiplexer 372. A control input of the fifth multiplexer 372 is coupled to the temperature change rate MSB 374.

In the example of FIG. 3B, the comparator hold register 216 includes a second example array of registers 376 (e.g., D-Latches). The second array of D-Latches 376 includes N number of latches to correspond to N number of bits in the slew rate from the output of the fifth multiplexer 372. The "D" input of each of N-number of D-latches 376 is connected to one of the N-number of signal lines of the output of the fifth multiplexer 372, and each of the N-number of "Q" outputs is connected to one of the N-number of signal lines connected to the slew rate output 218. The second array of D-Latches 376 includes a conversion clock input 378. The second array of D-Latches 376 is configured for each of the N number of D-Latches to correspond to a bit of the determined slew rate. Alternatively, the second array of D-Latches 376 may be an array of any latches, an array of any combination of latches, a register, or memory. The input of the second array of D-Latches 376 is coupled to the output of the fifth multiplexer 372.

In example operation, the third logic gate 354 determines if the temperature change rate is less than or equal to the value of the fifth reference register 352. The output of the third multiplexer 358 is coupled to the fourth array of temperature change rate inputs 370 based on the temperature change rate being greater than the fifth reference register 352. The fourth logic gate 362 determines if the temperature change rate is greater than or equal to the sixth reference register 360. The output of the fourth multiplexer 366 is coupled to the third array of temperature change rate inputs 368 based on the temperature change rate being less than the sixth reference register 360. The output of the fifth multiplexer 372 is coupled to the output of the third multiplexer 358 or the output of the fourth multiplexer 366 based on the temperature change rate MSB 374. The temperature change rate MSB 374 the is the MSB of the output of the division circuit 212 The temperature change rate MSB 374 may be coupled to the MSB of the output of the division circuit 212. Alternatively, the temperature change rate MSB 374 may be coupled to a register configured to store the MSB of the output of the division circuit 212. Advantageously, the comparison of the temperature change rate from the output of the second multiplexer 348 to the fifth reference register 352 and the sixth reference register 360 enables the slew rate threshold to be adjusted by changing the register values in the register bank 116 of FIG. 1. Advantageously, the output of the fifth multiplexer 372 is the determined slew rate between two temperature measurements.

Figure 4:
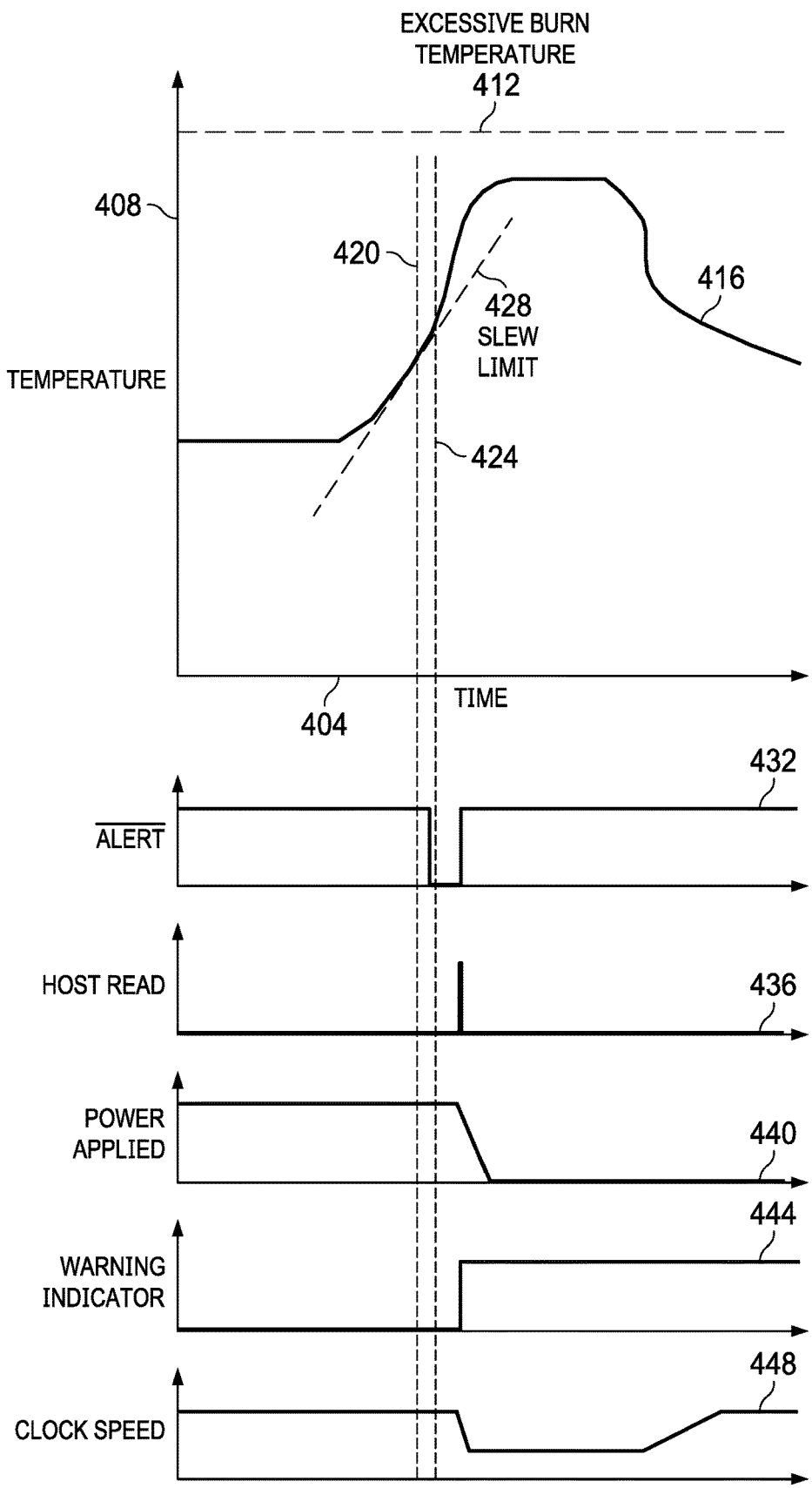
FIG. 4 is an example timing diagram of the circuit of FIG. 1 configured to alert the microcontroller to reduce the power to a system as a result of determining a high slew rate.

FIG. 4 is an example timing diagram of the circuit from FIG. 1 configured to alert the microcontroller to reduce the power to a system as a result of a high slew rate predicting a temperature above the high temperature threshold. In the example of FIG. 4, the example timing diagram includes an example time axis 404, an example temperature axis 408, an example temperature limit 412, a first example line 416, a first example temperature measurement 420, a second example temperature measurement 424, an example slew rate line 428, a second example line 432, a third example line 436, a fourth example line 440, a fifth example line 444, and a sixth example line 448.

In the example of FIG. 4, the first line 416 represents the measured temperature of the system hot spot 104 of FIG. 1. The slope of the first line 416 between any two points may be referred to as the slew rate (the change in temperature per unit time) of the measured temperatures. The circuit 100 of FIG. 1 records the first temperature measurement 420 and then records the second temperature measurement 424. The digital core 112 of FIG. 1 preforms the digital logic operations of FIGS. 3A and 3B to determine the slew rate represented by the slew rate line 428. The circuit 100 of FIG. 1 generates an alert pulse (ALERT-bar or the inverse of the ALERT signal) as demonstrated in the second line 432 as a response to the slew rate found by the digital core 112 of FIG. 1 indicating the system hot spot 104 of FIG. 1 is approaching an excessive temperature at the temperature limit 412. The alert output represented by the second line 432 may be configured as an active low signal or an active high signal with a pulse indicating a high slew rate predicting a temperature above the temperature limit 412.

In the example of FIG. 4, the digital core 112 of FIG. 1 sends an alert pulse demonstrated on the second line 432 by sending a pulse to the control terminal of the transistor 118 of FIG. 1. The alert pulse is measured by the host device 102 of FIG. 1 through the alert output terminal 120 of FIG. 1. The third line 436 indicates an acknowledgement by the host device 102 of FIG. 1 of the alert pulse being received. The acknowledgement by the host device 102 of FIG. 1 may be communicated to the circuit 100 of FIG. 1 through the communication terminal 128 of FIG. 1. The host device 102 of FIG. 1 may be configured to reduce the power supplied to the system (represented by the fourth line 440) to prevent the system hot spot 104 of FIG. 1 from reaching the temperature limit 412. In response to receiving an alert pulse, the host device 102 of FIG. 1 sets the warning indicator represented by the fifth line 444.

The host device 102 of FIG. 1 may be configured to throttle the clock (e.g. reduce the speed of the clock) as shown by the sixth line 448 to prevent the system hot spot 104 of FIG. 1 from reaching the temperature limit 412. The host device 102 of FIG. 1 reduces the power supplied to the system and throttles down the clock until the system determines that it is safe to return to normal operation. Advantageously, the circuit 100 of FIG. 1 determined the temperature slew rate of the system hot spot 104 of FIG. 1 to be approaching the temperature limit 412 and prevented the excessive temperature by sending an alert pulse to the host device 102 of FIG. 1. Advantageously, the circuit 100 of FIG. 1 monitored the temperature slew rate without increasing the processing load on the host device 102 of FIG. 1.

Figure 5:
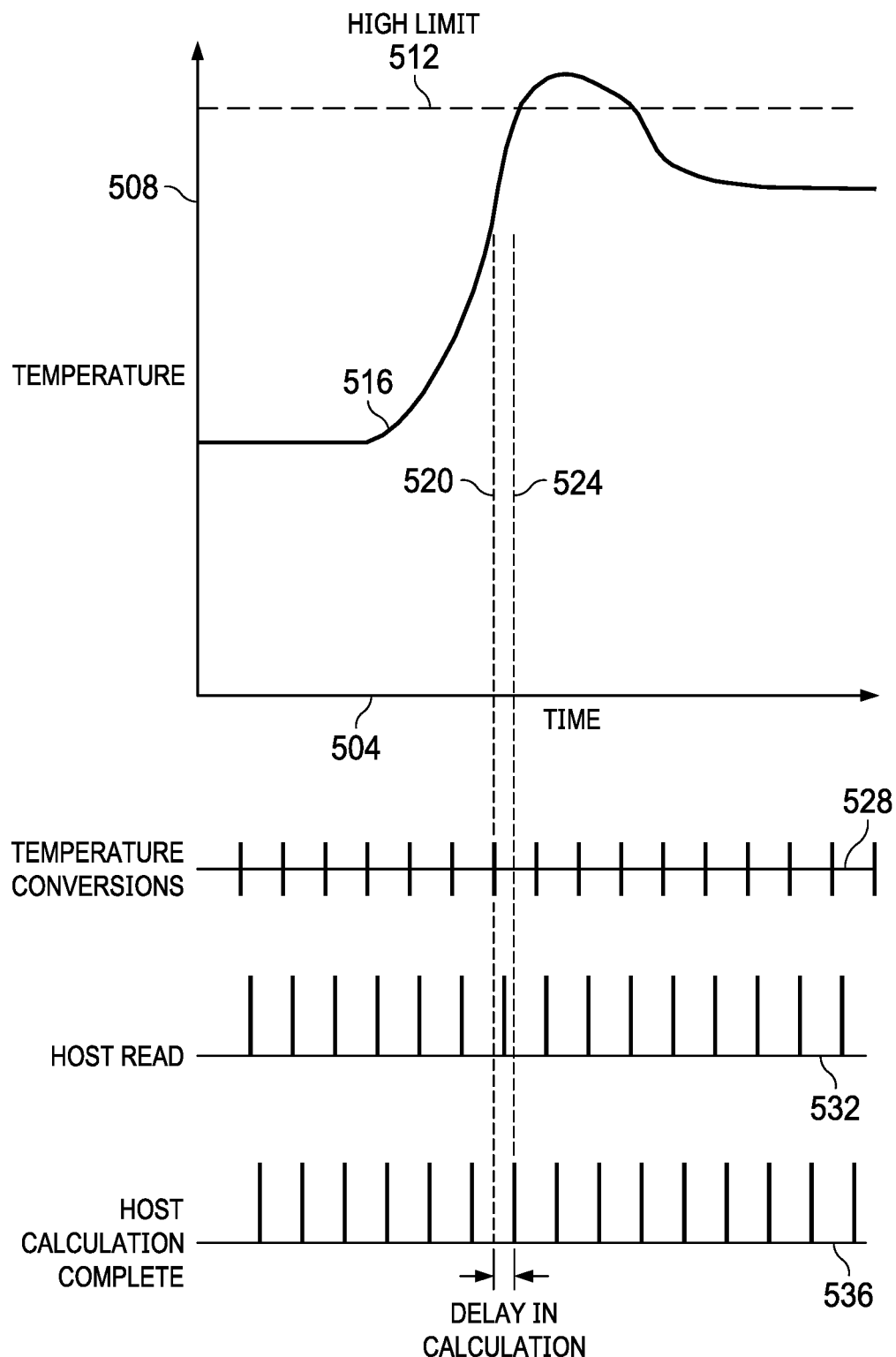
FIG. 5 is an example timing diagram of a microcontroller reading a temperature sensor using a timing waveform system, configured to reduce the power to a system as a result of a high temperature measurement.

FIG. 5 is an example timing diagram of a host device reading a temperature sensor using a timing waveform system, configured to reduce the power to a system as a result of a high temperature measurement. The conventional timing waveform system determines the system temperature is approaching the high temperature limit as a result of the host device periodically measuring the temperature and performing an ADC conversion as a result of the host device measuring the temperature. In the example of FIG. 5, the timing diagram includes an example horizontal time axis 504, an example vertical temperature axis 508, and example high temperature limit 512, a seventh example line 516, a first example time 520, a second example time 524, an eighth example line 528, a ninth example line 532, and a tenth example line 536.

In the example of FIG. 5, the conventional timing waveform method of monitoring the temperature of a system is demonstrated by the seventh line 516. The eighth line 528 is marked every time a temperature measurement is ready to be read by the host device. The ninth line 532 is marked every time the host device reads the temperature measurement value. The tenth line 536 is marked every time the host device completes the ADC calculation to determine the temperature of the system. The first time 520 represents the time the temperature is ready to be read by the host device. The second time 524 represents the time the host device calculates the digital value of the temperature measurement. The difference between the first time 520 and the second time 524 represents the delay of temperature monitoring using the conventional timing waveform method.

The conventional timing waveform method of monitoring the temperature of a system relies on the host device constantly polling the temperature, performing an analog to digital conversion, and determining if the system is approaching the high temperature limit 512. The conventional timing waveform method includes latency due to the delay between the temperature conversion and the host device read. The delay between the first time 520 and the second time 524 represents the minimum time the conventional timing waveform system takes to respond to a temperature approaching the high temperature limit 512.

Figure 6:
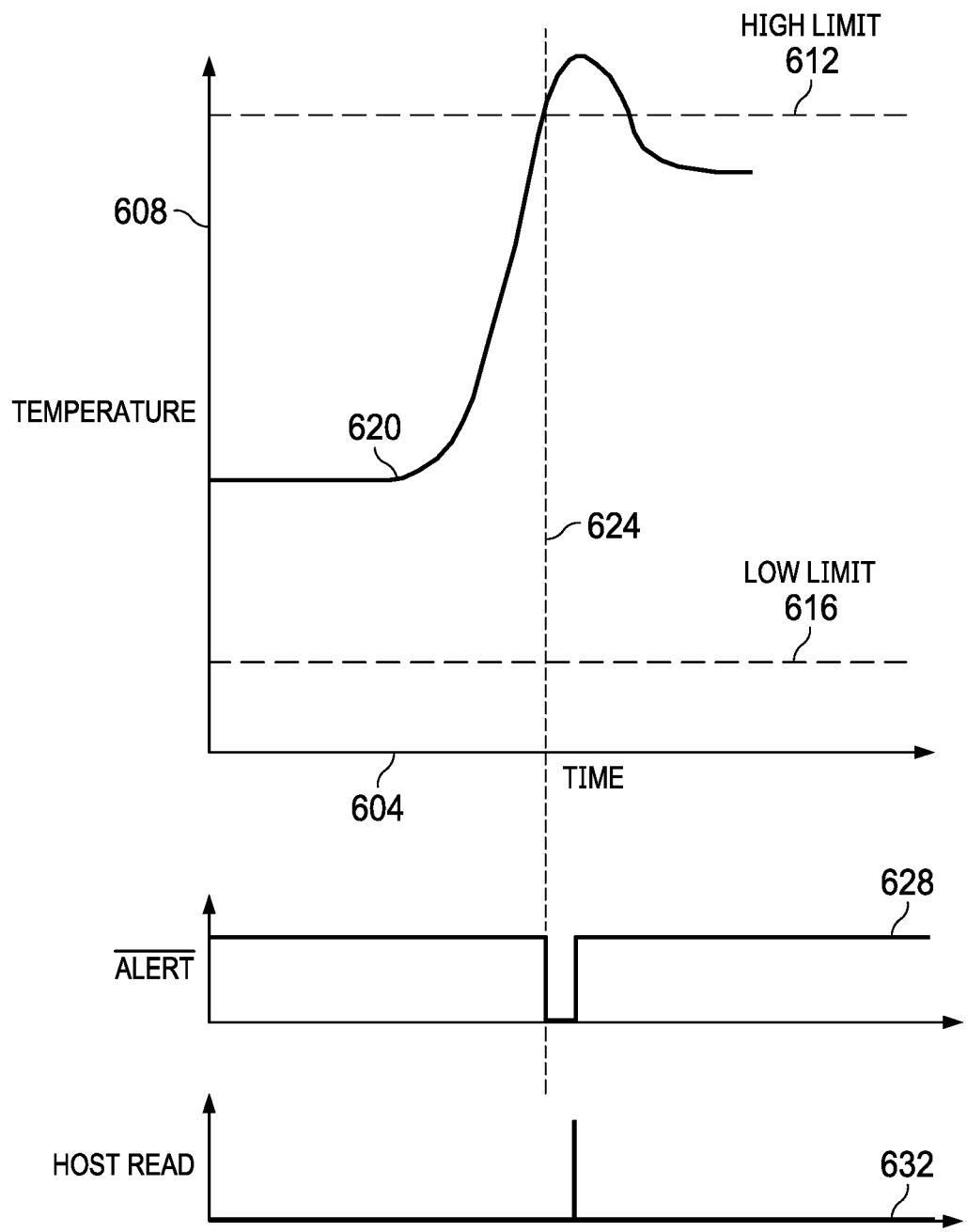
FIG. 6 is an example timing diagram of a microcontroller reading a temperature probe using an absolute threshold system, configured to reduce the power to a system as a result of a high temperature measurement.

FIG. 6 is an example timing diagram of a host device reading a temperature sensor using an absolute threshold system, configured to reduce the power to a system as a result of a high temperature measurement. The conventional absolute threshold system monitors the temperature of a system by constantly measuring the temperature of the system. The host device will reduce the power to the system in response to a measured temperature being greater than or equal to the high temperature limit. In the example of FIG. 6, the example timing diagram demonstrates the operation of an example conventional absolute threshold system. The timing diagram includes an example horizontal time axis 604, an example vertical temperature axis 608, an example high temperature limit 612, an example low temperature limit 616, an eleventh example line 620, a third example time 624, a twelfth example line 628, and a thirteenth example line 632.

In the example of FIG. 6, the eleventh line 620 represents the measured temperature of the system hot spot over time. At the third time 624, the measured temperature is determined to be greater than or equal to the high temperature limit 612. The twelfth line 628 indicates that an alert pulse is generated as a response to the temperature measurement being greater than or equal to the high temperature limit 612. The thirteenth line 632 indicates that the host device acknowledges the alert pulse. The host device responds to the temperature of the system reaching the high temperature limit 612 only after the system temperature exceeded the high temperature limit 612. The conventional absolute threshold system enables system hot spots to reach the high temperature limit 612 before responding, unlike the circuit 100 of FIG. 1.

Various forms of the term "couple" are used throughout the specification. These terms may cover connections, communications, or signal paths that enable a functional relationship consistent with the description of the present disclosure. For example, if device A generates a signal to control device B to perform an action, in a first example device, A is coupled to device B by direct connection, or in a second example device, A is coupled to device B through intervening component C if intervening component C does not alter the functional relationship between device A and device B such that device B is controlled by device A via the control signal generated by device A.

Consistent with the present disclosure, the term "configured to" describes the structural and functional characteristics of one or more tangible non-transitory components. For example, a device that is "configured to" perform a function mean that the device has a particular configuration that is designed or dedicated for performing a certain function. A device is "configured to" perform a certain function if such a device includes tangible non-transitory components that can be enabled, activated, or powered to perform that certain function. While the term "configured to" may encompass being configurable, this term is not limited to such a narrow definition. Thus, when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more implementations, equivalent alterations and modifications will be apparent upon a reading and understanding of this specification and the annexed drawings. All such modifications and alterations are fully supported by the disclosure and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in an example particular order, this does not require that such operations be performed in the example particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above does not require such separation in all embodiments.

Descriptors "first," "second," "third," etc. are used herein when identifying multiple elements or components which may be referred to separately. Unless otherwise specified or understood based on their context of use, such descriptors do not impute any meaning of priority, physical order, or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While the example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

The following claims are hereby incorporated into this Detailed Description by this reference, with each claim standing on its own as a separate embodiment of the present disclosure.

What is claimed is:

1. An apparatus comprising:
a register including an input and an output, and configured to receive at the input a first data based on a first temperature value, and to generate at the output a second data based on a second temperature value;
a subtraction circuit including a first subtraction input, a second subtraction input, and a subtraction output, the first subtraction input coupled to the input of the register, the second subtraction input coupled to the output of the register;
a timing circuit including a cycle time input, a shift output, and a direction output; and
a division circuit including a division input, a shift input, a direction input, and a divided output, the division input coupled to the subtraction output, the shift input coupled to the shift output, the direction input coupled to the direction output.

2. The apparatus of claim 1, wherein the register includes a plurality of latches coupled to a plurality of inputs based on a temperature value.

3. The apparatus of claim 1, wherein the register includes a conversion clock input coupled to a clock signal.

4. The apparatus of claim 1, wherein the subtraction circuit includes plurality of subtraction inputs coupled to a plurality of latch outputs based on a plurality of bits in a temperature value.

5. The apparatus of claim 1, wherein the subtraction circuit includes a plurality of bits additional to the bits of a temperature value coupled to the division input.

6. The apparatus of claim 1, wherein the timing circuit is configured to determine a number of cycles between the first temperature value and the second temperature value.

7. The apparatus of claim 1, wherein the division circuit to bit shift the division input based on the shift input and direction input.

8. The apparatus of claim 1, wherein the apparatus further includes a comparator circuit including a comparator input and a comparator output, the comparator input coupled to the divided output.

9. The apparatus of claim 8, wherein the apparatus further includes a hold register including a hold input, the hold input coupled to the comparator output.

10. A method comprising:
receiving a first data based on a measured first temperature value;
receiving a second data based on a measured second temperature value;
subtracting the first data from the second data to generate a primary data;
measuring a time elapsed between measuring the first temperature value and the second temperature value to generate a shift value and a direction value;
modifying the primary data based on the shift value and the direction value to generate a slew rate; and
comparing the slew rate to a reference value.

11. The method of claim 10 further comprising generating an alert pulse when the slew rate is higher than the reference value.

12. The method of claim 10, wherein measuring the time elapsed between measuring the first temperature value and the second temperature value further comprising:
receiving a first digital bit representation of a cycle time input corresponding to an instant at which the first temperature is measured;
receiving a second digital bit representation of a cycle time input corresponding to an instant at which the second temperature is measured; and
subtracting the first digital bit representation from the second digital bit representation.

13. The method of claim 12, wherein modifying the primary data further comprising:
shifting bits of the primary data by N bits when the shift value is N, and N is an integer; and
shifting bits of the primary data to right or left based on the direction value.

14. A system comprising:
a temperature sensor circuitry configured to measure a first temperature value and a second temperature value;
a host configured to receive an alert pulse; and
a digital core coupled to the temperature sensor and the host, the digital core further including:
a register including an input and an output, and configured to receive at the input a first data based on the first temperature value, and to generate at the output a second data based on the second temperature value;
a subtraction circuit including a first subtraction input, a second subtraction input, and a subtraction output, the first subtraction input coupled to the input of the register, the second subtraction input coupled to the output of the register;
a timing circuit including a cycle time input, a shift output, and a direction output; and
a division circuit including a division input, a shift input, a direction input, and a divided output, the division input coupled to the subtraction output, the shift input coupled to the shift output, the direction input coupled to the direction output.

15. The system of claim 14, wherein the subtraction circuit is configured to receive the first data at the first subtraction input and the second data at the second subtraction input.

16. The system of claim 15, wherein the subtraction circuit is configured to subtract the first data from the second data to generate a primary data at the subtraction output.

17. The system of claim 16, wherein the timing circuit is configured to measure a time elapsed between measuring the first temperature value and the second temperature value to generate a shift value at the shift output and a direction value at the direction output.

18. The system of claim 17, wherein the division circuit is configured to modify the primary data received on the division input based on the shift value received at the shift input and the direction value received at the direction input.

19. The system of claim 18, wherein the division circuit is configured to generate a slew rate at the divided output by:
shifting bits of the primary data by N bits when the shift value is N, and N is an integer; and
shifting bits of the primary data to right or left based on the direction value.

20. The system of claim 19, wherein the digital core is configured to provide the alert pulse to the host when the slew rate is higher than a reference value.

* * * * *